(12) United States Patent
Hung

(10) Patent No.: US 11,128,070 B2
(45) Date of Patent: Sep. 21, 2021

(54) ELECTRICAL TERMINAL AND ELECTRICAL CONNECTOR THEREOF

(71) Applicant: Dongguan Luxshare Technologies Co., Ltd, Dongguan (CN)

(72) Inventor: Yung-Chih Hung, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 16/870,544

(22) Filed: May 8, 2020

(65) Prior Publication Data
US 2020/0274268 A1 Aug. 27, 2020

(30) Foreign Application Priority Data

Oct. 30, 2019 (TW) ................................ 108139363

(51) Int. Cl.
*H01R 12/70* (2011.01)
*H01R 12/55* (2011.01)
(Continued)

(52) U.S. Cl.
CPC ......... *H01R 12/7011* (2013.01); *H01R 12/55* (2013.01); *H01R 13/502* (2013.01);
(Continued)

(58) Field of Classification Search
CPC ...... H01R 13/42; H01R 13/10; H01R 13/113; H01R 13/46; H01R 4/185; H01R 33/945;
(Continued)

(56) References Cited

U.S. PATENT DOCUMENTS 6,319,075 B1 * 11/2001 Clark ..................... H01R 13/11
439/65
6,848,950 B2 * 2/2005 Allison .................. H01R 12/75
439/682
(Continued)

FOREIGN PATENT DOCUMENTS

CN 1682414 B 5/2010
CN 203747183 U 7/2014
(Continued)

*Primary Examiner* — Abdullah A Riyami
*Assistant Examiner* — Nader J Alhawamdeh
(74) *Attorney, Agent, or Firm* — Birch, Stewart, Kolasch & Birch, LLP

(57) ABSTRACT

An electrical terminal includes a terminal body, at least one interference lug, and at least one circuit connection part. The terminal body includes a front end and a back end in a longitudinal direction. The interference lug is arranged in parallel to the longitudinal direction and extends outwardly in a horizontal direction perpendicular to the longitudinal direction. The at least one circuit connection part is connected to the terminal body. An electrical connector is also provided, and the electrical connector includes a base and the electrical terminal. The base includes at least one installation trough, and a guiding groove is arranged in the at least one installation trough, the at least one interference lug is adapted to slide into the guiding groove, so as to guide and position the electrical terminal.

14 Claims, 15 Drawing Sheets

(51) Int. Cl.
  *H01R 13/502* (2006.01)
  *H05K 3/34* (2006.01)
  *H05K 3/30* (2006.01)

(52) U.S. Cl.
  CPC ........... *H05K 3/301* (2013.01); *H05K 3/3447* (2013.01); *H05K 2201/10189* (2013.01); *H05K 2201/10431* (2013.01); *H05K 2201/10742* (2013.01)

(58) Field of Classification Search
  CPC .. H01R 12/7011; H01R 12/55; H01R 13/502; H01K 3/301; H01K 3/3447; H05K 2201/10189; H05K 2201/10431; H05K 2201/10742
  See application file for complete search history.

(56) References Cited

U.S. PATENT DOCUMENTS

| | | | |
|---|---|---|---|
| 7,744,408 B2 | 6/2010 | Komatsu | |
| 8,267,724 B2* | 9/2012 | Dodds | H01R 13/113 439/660 |
| 8,323,049 B2 | 12/2012 | Ngo | |
| 8,449,338 B2* | 5/2013 | Gong | H01R 13/113 439/839 |
| 8,591,250 B2* | 11/2013 | Chin | H01R 12/724 439/485 |
| 8,602,796 B2* | 12/2013 | Chin | H01R 13/055 439/79 |
| 8,801,474 B2* | 8/2014 | Rong | H01R 13/113 439/737 |
| 8,968,009 B2* | 3/2015 | Chen | H01R 12/7088 439/79 |
| 9,059,546 B2* | 6/2015 | Yu | H01R 31/085 |
| 9,362,675 B2* | 6/2016 | Yu | H01R 12/724 |
| 9,515,406 B2* | 12/2016 | Yu | H01R 13/41 |
| 9,537,242 B2* | 1/2017 | Chen | H01R 13/18 |
| 9,711,897 B2* | 7/2017 | Ho | H01R 13/113 |
| 2015/0200485 A1* | 7/2015 | Yu | H01R 13/521 439/521 |
| 2016/0226176 A1* | 8/2016 | Yu | H01R 4/02 |
| 2020/0274268 A1* | 8/2020 | Hung | H01R 13/41 |
| 2020/0280142 A1* | 9/2020 | Hung | H01R 9/24 |

FOREIGN PATENT DOCUMENTS

| | | |
|---|---|---|
| CN | 102301537 B | 8/2014 |
| CN | 206283014 U | 6/2017 |
| CN | 206283046 U | 6/2017 |
| CN | 206806561 U | 12/2017 |
| CN | 206908021 U | 1/2018 |
| CN | 207265268 U | 4/2018 |
| CN | 207910108 U | 9/2018 |

* cited by examiner

ELECTRICAL TERMINAL AND ELECTRICAL CONNECTOR THEREOF

CROSS-REFERENCE TO RELATED APPLICATION

This non-provisional application claims priority under 35 U.S.C. § 119(a) to Patent Application No. 108139363 in Taiwan, R.O.C. on Oct. 30, 2019, the entire contents of which are hereby incorporated by reference.

BACKGROUND

Technical Field

This disclosure relates to an electrical terminal and an electrical connector, in particular, to an electrical terminal and an electrical connector including the electrical terminal.

Related Art

A large electrical terminal, especially a power terminal, is usually made of a metal sheet bent into a U-shaped structure. A pin of the electrical terminal extends from the bottom (the opening side of the U-shaped structure). An electrical-insulated base for installing a power supply terminal is provided with an installation trough is opened at the bottom of the electrical-insulated base. The U-shaped body of the electrical terminal is installed in the installation trough, and the pin protrudes from the bottom of the electrical-insulated base. Finally, the pin is inserted into a soldering hole of a circuit board for soldering, and the electrical-insulated base is fixed to the circuit board with a fastening member, so that the whole electrical connector can be fixed with the circuit board.

The configuration of the U-shaped body can be easily deformed, so that the pin at the opening side of the U-shaped body may be inclined outwardly or inwardly, resulting in the change of the relative positions between the pins. Consequently, the pins cannot match with the soldering holes of the circuit board. Under such condition, all of the pins cannot be aligned with the soldering holes, resulting in assembly difficulties. Moreover, the electrical-insulated base also lacks a structure for positioning the U-shaped body. Thus, during the assembly process, the U-shaped body may be detached from its proper position in the electrical-insulated base, thereby further worsening the problem of the poor alignments between the pins and the soldering holes. Especially, when the electrical connector includes plural power terminals, the pin alignment problem may be more serious.

SUMMARY

In order to solve the problem of fixing and positioning the electrical terminal in the electrical connector, one or some embodiments of this disclosure propose an electrical terminal and an electrical connector. Accordingly, the electrical terminal can be fixed and positioned effectively, thereby making the electrical connector easy in assembling and easy in mounting to the circuit board.

An electrical terminal is provided according to one embodiment of this disclosure. The electrical terminal comprises a terminal body, at least one interference lug, and at least one circuit connection part. The terminal body includes a front end and a back end in a longitudinal direction. The at least one interference lug is arranged in parallel to the longitudinal direction and extends outwardly in a horizontal direction perpendicular to the longitudinal direction. The at least one circuit connection parts is connected to the terminal body.

In one or more embodiments, the terminal body comprises two lateral plates opposite to each other and a junction part, each of the lateral plates includes an upper edge and a lower edge, the junction part is connected to the upper edge of each of the lateral plates. The at least one interference lug extends to a connection portion between the junction part and one of the lateral plates. The at least one circuit connection part is on one of the lower edges.

In one or more embodiments, the at least one interference lug is coplanar with the junction part.

In one or more embodiments, a cutting slot-hole is formed at the connection portion between the junction part and one of the lateral plates, and the at least one interference lug is at an edge of the cutting slot-hole.

In one or more embodiments, the junction part is connected to portions of the two upper edges corresponding to the back end of the terminal body.

In one or more embodiments, the electrical terminal further comprises a contact part on the front end of the terminal body.

In one or more embodiments, the contact part comprises a plurality of elastic contact pieces extending outwardly in the longitudinal direction from each of the lateral plates.

In one or more embodiments, the elastic contact pieces are configured in pairs, and the front end of each of the elastic contact pieces forms a guiding bevel inclined inwardly.

An electrical connector is further provided according to one embodiment of this disclosure. The electrical connector comprises a base and at least one electrical terminal. The base includes a front surface, a rear surface, and an outer peripheral surface, the front surface and the rear surface are opposite to each other, and the outer peripheral surface is connected to the front surface and the rear surface. At least one installation trough is on the rear surface, and the at least one installation trough is in communication with the front surface through an insertion hole. At least one guiding groove is arranged in the installation trough, and the guiding groove is opened at a periphery of an opening of the at least one installation trough and extending toward the insertion hole without connecting to the insertion hole. The electrical terminal includes a terminal body, at least one interference lug, and at least one circuit connection part. The terminal body includes a front end and a back end in a longitudinal direction. The at least one interference lug is parallel to the longitudinal direction and extends outwardly in a horizontal direction perpendicular to the longitudinal direction. The at least one circuit connection part is connected to the terminal body and perpendicular to the longitudinal direction. The front end of the terminal body is inserted into the at least one installation trough.

In one or more embodiments, the installation trough includes an upper wall surface, a lateral opening, and two lateral wall surfaces. The two lateral wall surfaces are connected to the upper wall surface and the lateral opening, the lateral opening is in communication with the outer peripheral surface, and the guiding groove is on one of the two lateral wall surfaces. The terminal body comprises two lateral plates opposite to each other and a junction part, each of the lateral plates includes an upper edge and a lower edge, the junction part is connected to the upper edge of each of the lateral plates. The at least one interference lug extends to a connection portion between the junction part and one of the lateral plates. The at least one circuit connection part is on one of the lower edges and protrudes from the base through the lateral opening.

In one or more embodiments, a first guiding protrusion is on the upper wall surface, the first guiding protrusion is between the two lateral wall surfaces and not connected to the two lateral wall surfaces, the first guiding protrusion extends from the insertion hole toward an opening on the rear surface of the at least one installation trough, and the first guiding protrusion enters into a portion between the two lateral plates corresponding to the front end.

In one or more embodiments, a distance between a front edge of the first guiding protrusion and an edge of the opening of the at least one installation trough on the rear surface is equal to or less than a length of the guiding groove. In one or more embodiments, a second guiding protrusion extending from the insertion hole toward the rear surface is in the lateral opening. Two open slot-holes are between the second guiding protrusion and the two lateral wall surfaces, and the two open slot-holes are arranged in parallel to each other. The at least one circuit connection part enters into one of the two open slot-holes, so that the at least one circuit connection part protrudes out of the base.

In one or more embodiments, the electrical connector further comprises a circuit board. The circuit board includes at least one soldering hole and at least one fixation hole, and the base further comprises at least one fixing structure. The at least one circuit connection part is inserted into the at least one soldering hole, and the at least one fixing structure is inserted into the at least one fixation hole.

In one or more embodiments, the electrical terminal further comprises a contact part on the front end of the terminal body, and the contact part in the at least one installation trough is inserted into the insertion hole and protrudes from the front surface.

In one or more embodiments of this disclosure, the electrical terminal includes at least one interference lug to match the at least one installation trough of the base, for positioning and guiding the electrical terminal, thereby ensuring that the electrical terminal can be inserted into the at least one installation trough in the correct direction while maintaining the relative position of the electrical terminal in the base. Furthermore, other structures disclosed in one or more embodiments of this disclosure further provide positioning and guiding functions for the electrical terminal, thereby ensuring that the electrical terminal from being installed incorrectly, and avoiding the deformation of the electrical terminal.

BRIEF DESCRIPTION OF THE DRAWINGS

The present invention will become more fully understood from the detailed description given herein below for illustration only, and thus not limitative of the present invention, wherein.

DETAILED DESCRIPTION

Please refer to FIGS. 1, 2, 3, and 4, where an electrical terminal 100 according to a first embodiment of this disclosure is illustrated. In this embodiment, the electrical terminal 100 is adapted to be combined with a base 200 to form an electrical connector 1. The electrical connector 1 may be further soldered or fixed to a circuit board 300 by other ways. The electrical terminal 100 may be, but not limited to, a power terminal for power transmission or a signal terminal for signal transmission.

Figure 4:
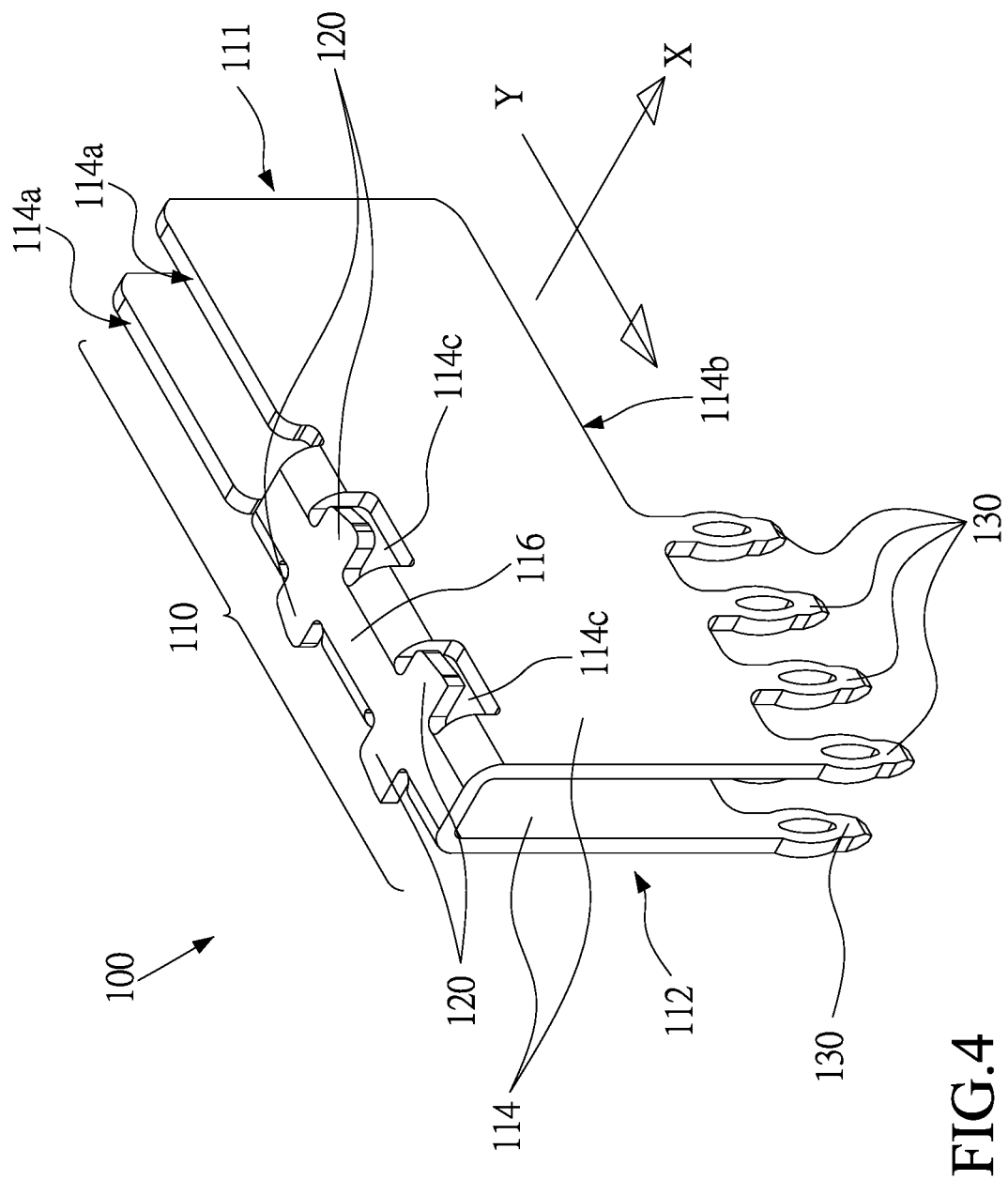
FIG. 4 illustrates a perspective view of an electrical terminal of the electrical connector of the first embodiment.

As shown in FIG. 4, the electrical terminal 100 comprises a terminal body 110, at least one interference lug 120, and at least one circuit connection part 130. The terminal body 110 includes a front end 111 and a back end 112 in a longitudinal direction Y. The interference lug 120 protrudes from a surface of the terminal body 110, the interference lug 120 is arranged in parallel to the longitudinal direction Y, and the interference lug 120 extends outwardly in a horizontal direction X perpendicular to the longitudinal direction Y. The circuit connection part 130 is connected to the terminal body 110. In the first embodiment, the number of the circuit connection part 130 may be one or more. The circuit connection part 130 is a pin and is integrally formed with the terminal body 110 as a one-piece member. The circuit connection part 130 is perpendicular to the longitudinal direction Y for soldering or mounting to the circuit board 300. However, embodiments of this disclosure does not exclude other forms of circuit connection part 130, for example, the circuit connection part 130 may be a cable clamping part, a perforation, or a soldering piece for direct connection to the cable; Alternatively, the circuit connection part 130 may also be parallel to the longitudinal direction Y and connected to the back end 112 of the terminal body 110.

Please refer to FIG. 4 again. Specifically, in one embodiment, the manufacturing process of the electrical terminal 100 is applying a stamping process to a metal sheet. So that the terminal body 110 becomes a tubular structure or a U-shaped channel structure, and an open or half-open hollow space is defined in the terminal body 110. The terminal body 110 adopted in the first embodiment is a U-shaped channel structure with one side partially or totally opened. The terminal body 110 comprises two lateral plates 114 opposite to each other and a junction part 116. Each of the lateral plates 114 includes an upper edge 114a and a lower edge 114b, and the junction part 116 is connected to the upper edges 114a of the two lateral plates 114. The two lateral plates 114 are approximately arranged in parallel to each other and arranged in parallel to the longitudinal direction Y.

As shown in FIG. 4, one or more circuit connection parts 130 are on one of the two lower edges 114b. The number of the interference lug 120 may be one or more. Each of the interference lugs 120 extends to a connection portion between the junction part 116 and one of the two lateral plates 114, and each of the interference lugs 120 is approximately coplanar with the junction part 116. Specifically, in one embodiment, before the metal sheet is stamped, the interference lug 120 is a portion of each lateral plate 114, and in this embodiment, a cutting blade hole is formed only at an edge of a portion of the interference lug 120. When the two lateral plates 114 are bent, the portion of the interference lug 120 is not bent, so that the interference lug 120 coplanar with the junction part 116 is formed, and a cutting slot-hole 114c is formed at the connection portion between the junction part 116 and the two lateral plates 114. The interference lug 120 is at an edge of the cutting slot-hole 114c, and extends to the junction part 116. The number of the interference lug 120 is not limited, and may be configured on one side only; that is, in this embodiment, the interference lug 120 may be only configured at the connection portion between the junction part 116 and one of the two lateral plates 114. Moreover, in this embodiment, the lengths of the protruding portions (which are protruding in the horizontal direction X) of the interference lugs 120 located at the connection portions on the same side are substantially equal to each other.

Furthermore, in one or some embodiments, the junction part 116 may be only connected to a portion of the upper edge 114a of the two lateral plates 114, particularly, in one or some embodiments, the junction part 116 may be connected to the portion corresponding to the back end 112 of the terminal body 110; while a portion of the two lateral plates 114 corresponding to the front end 111 of the terminal body 110 remains separated. The portions of the two lateral plates 114 corresponding to the front end 111 of the terminal body 110 can be used as a contact part. Hence, an external terminal can be inserted into a portion between the two lateral plates 114 and in contact with the two lateral plates 114.

Figure 1:
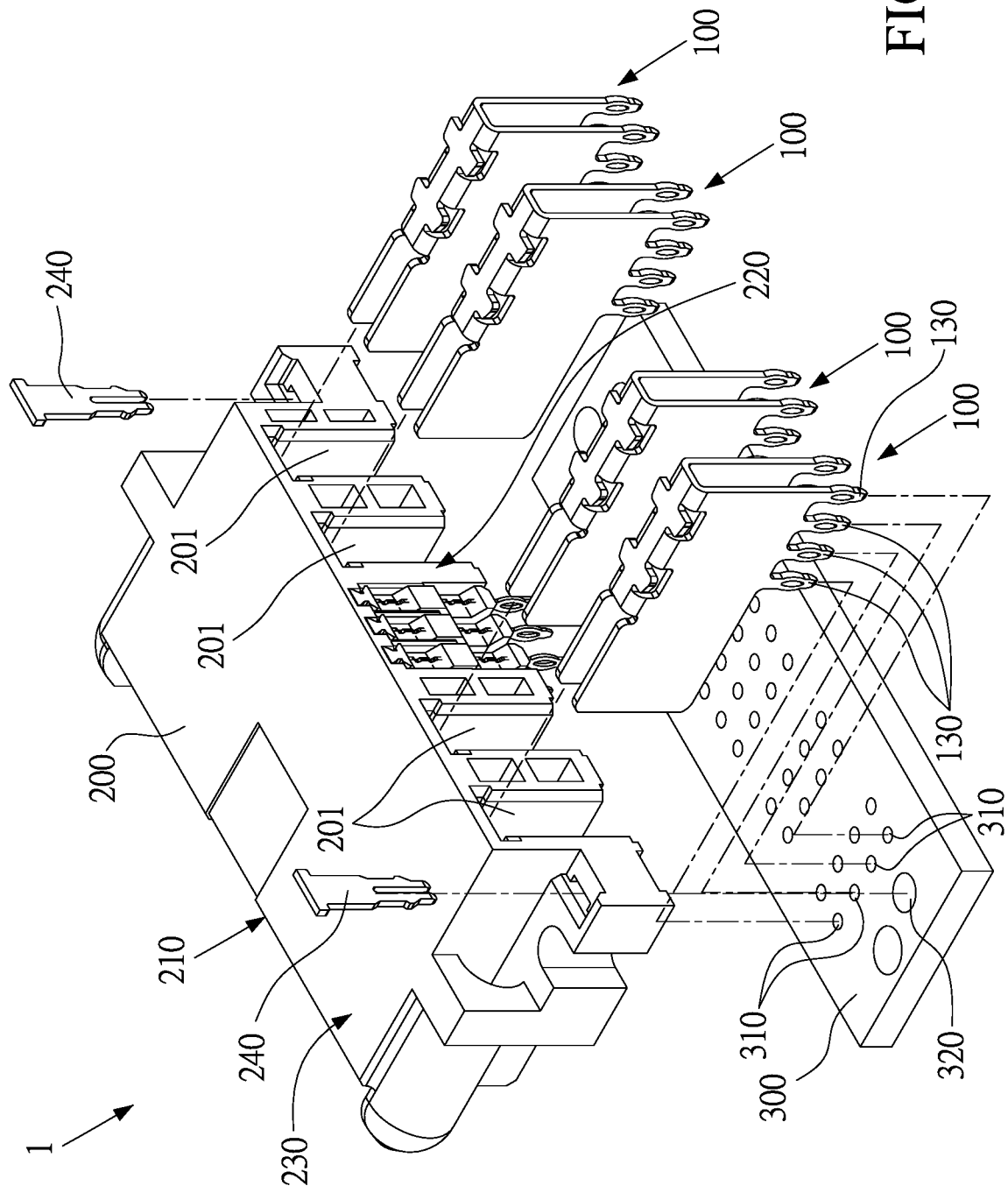
FIG. 1 illustrates an exploded view of an electrical connector according to a first embodiment of this disclosure.
Figure 2:
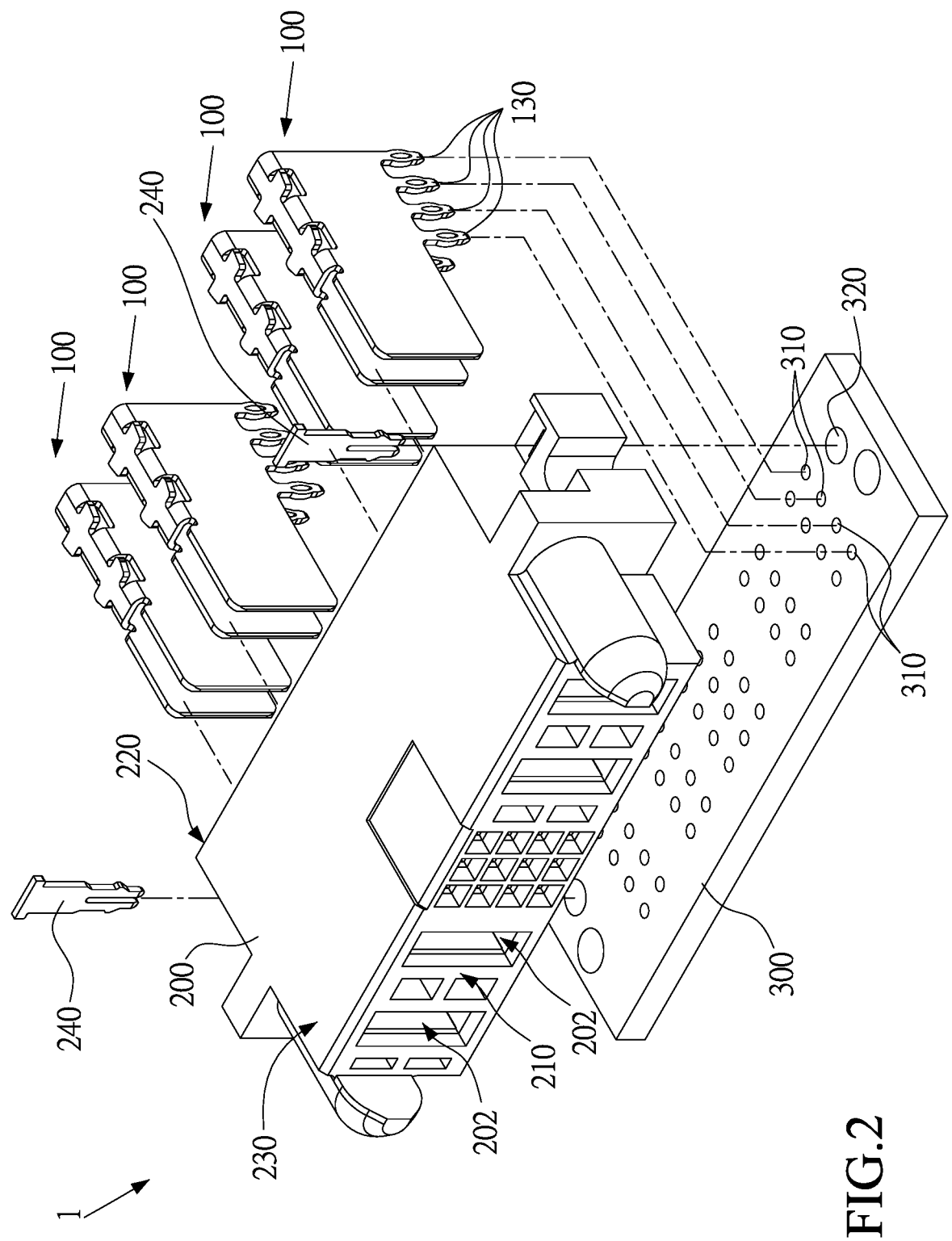
FIG. 2 illustrates another exploded view of the electrical connector of the first embodiment.
Figure 3:
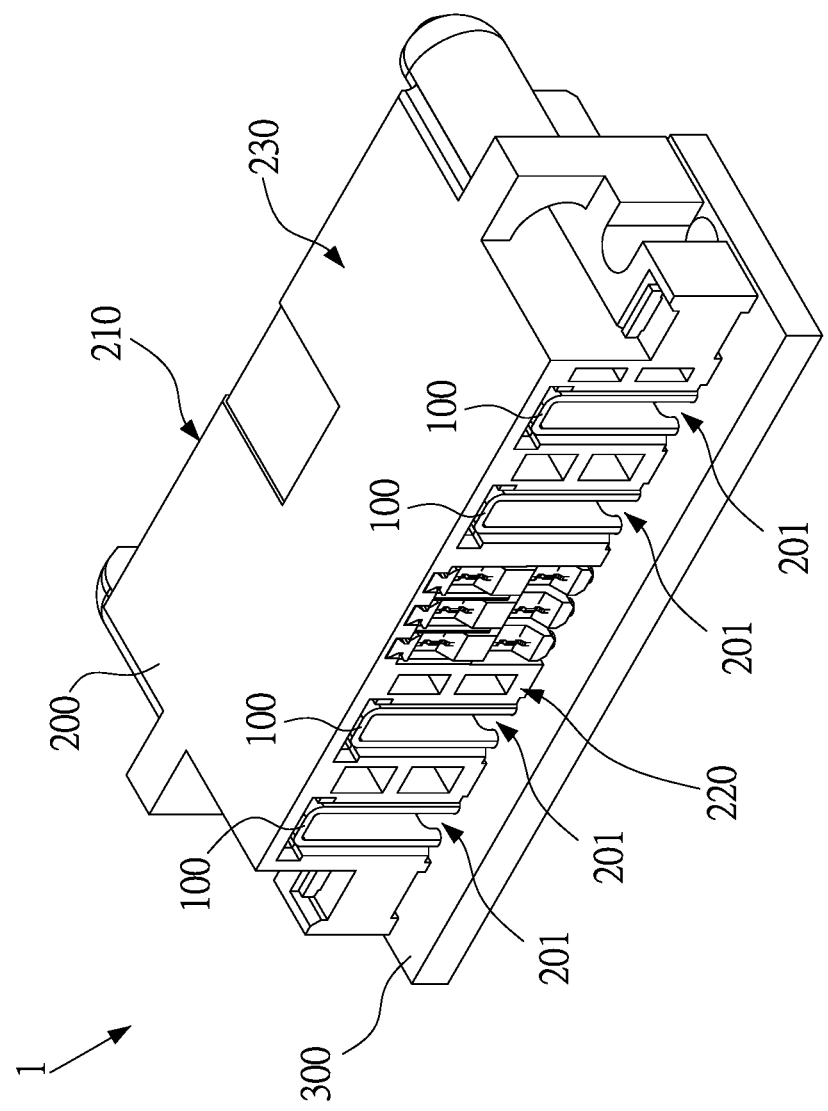
FIG. 3 illustrates a perspective view of the electrical connector of the first embodiment.

As shown in FIGS. 1, 2, and 3, the base 200 includes a front surface 210, a rear surface 220, and an outer peripheral surface 230. The front surface 210 and the rear surface 220 are opposite to each other, and the outer peripheral surface 230 is connected to the front surface 210 and the rear surface 220. The outer peripheral surface 230 may be a single continuous curved surface, or may be formed by connecting a plurality of planes and curved surfaces. One or more installation troughs 201 are on the rear surface 220 for inserting the electrical terminal 100 therein, and each of the installation troughs 201 is in communication with the front surface 210 through an insertion hole 202.

Figure 5:
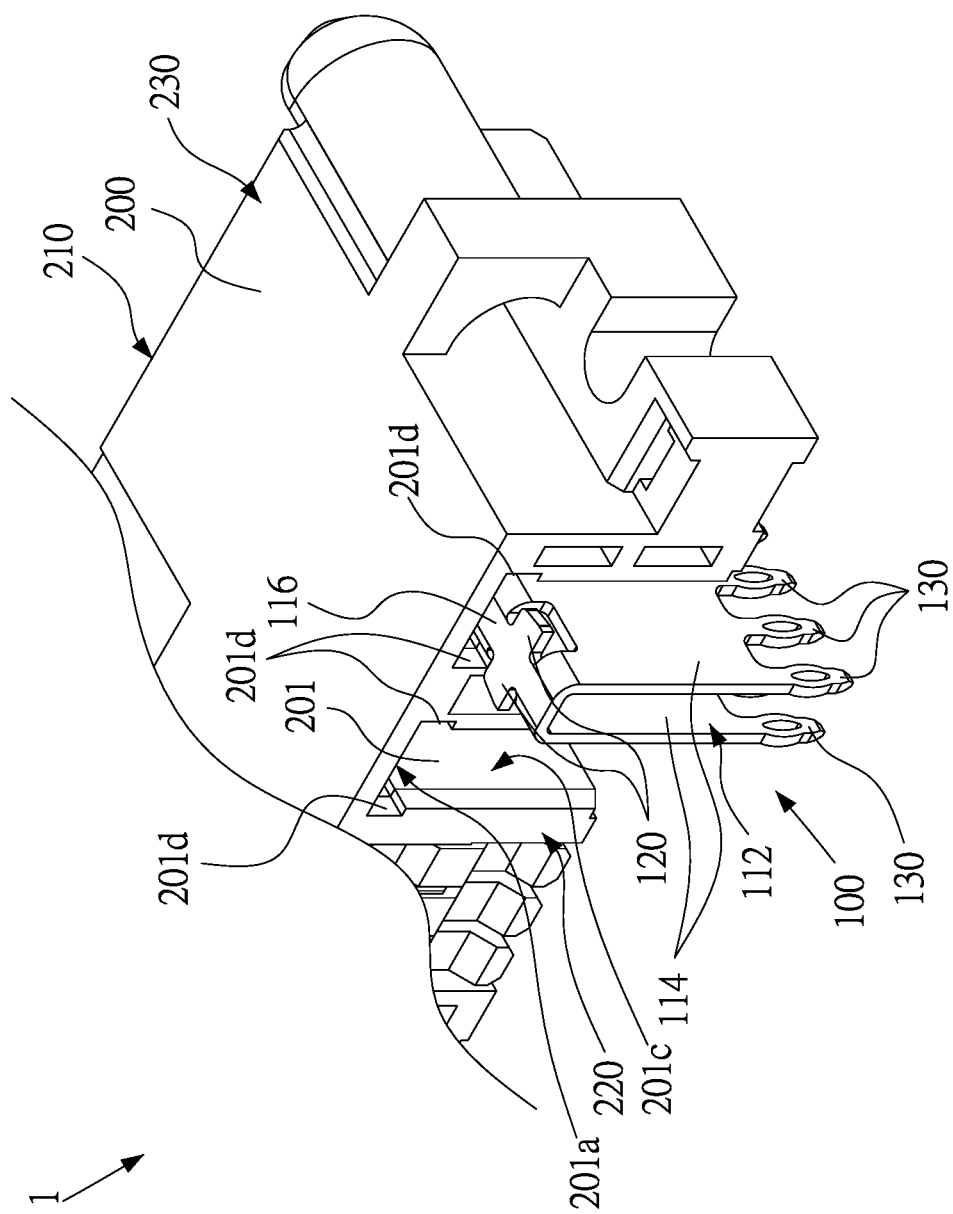
FIG. 5 illustrates a partial perspective view of the electrical connector of the first embodiment.
Figure 6:
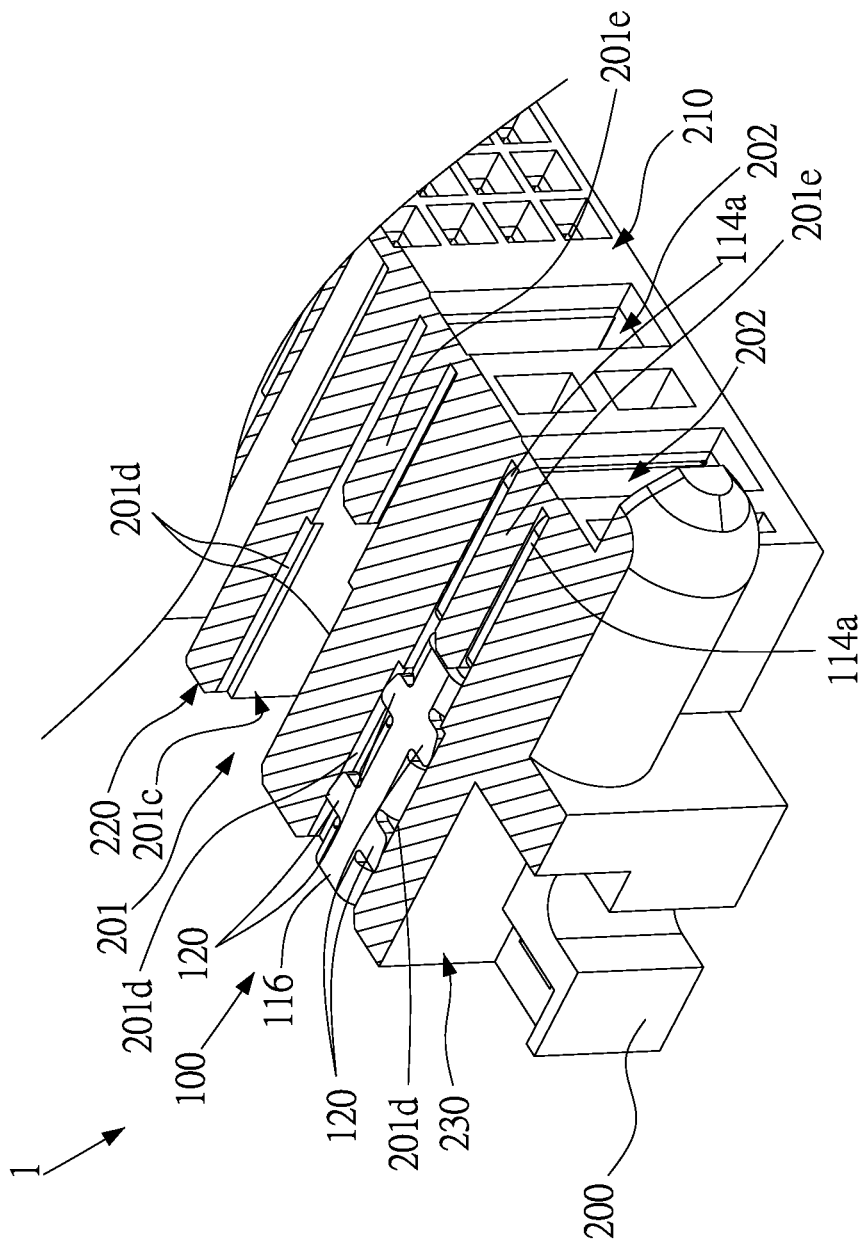
FIG. 6 illustrates a partial cross-sectional view of the electrical connector of the first embodiment.
Figure 7:
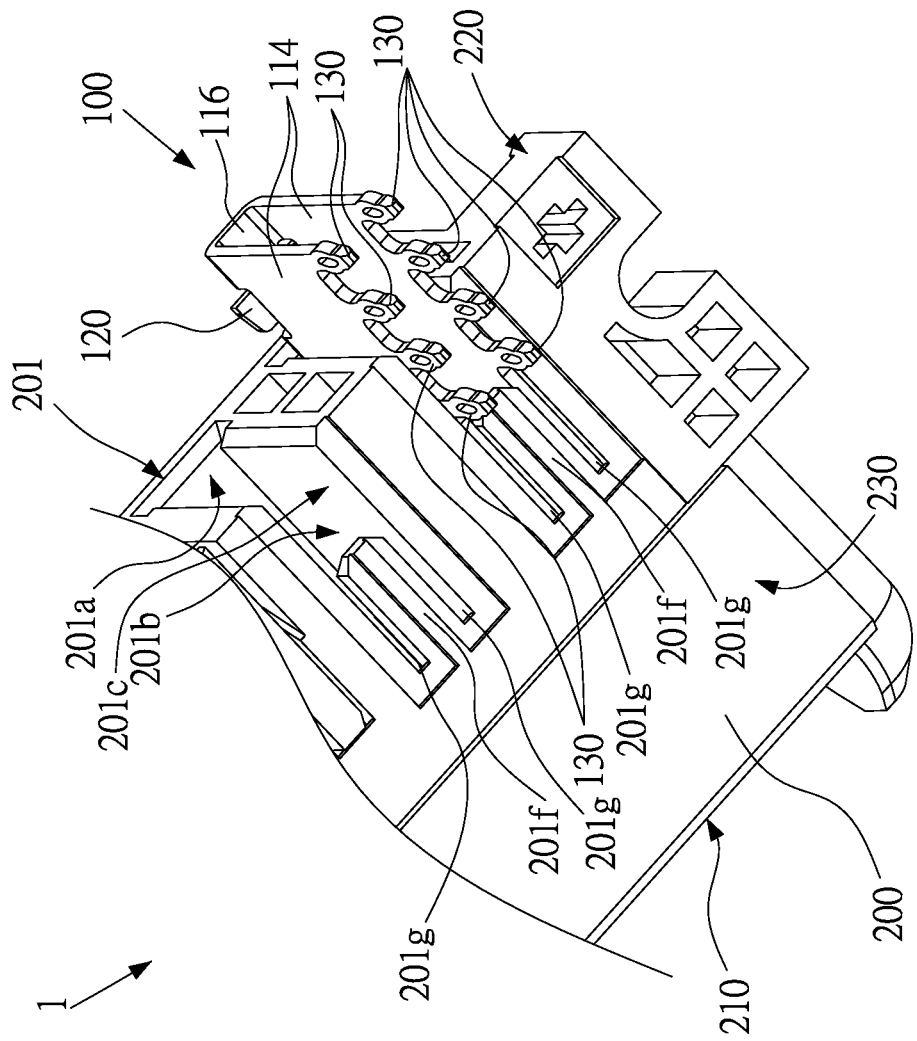
FIG. 7 illustrates another partial perspective view of the electrical connector of the first embodiment.

As shown in FIGS. 5, 6, and 7, the configuration of the installation trough 201 matches the configuration of the electrical terminal 100, so as to guide the electrical terminal 100 from plural aspects and to limit the electrical terminal 100 therein. The installation trough 201 includes an upper wall surface 201a, a lateral opening 201b, and two lateral wall surfaces 201c. The two lateral wall surfaces 201c are connected to the upper wall surface 201a and the lateral opening 201b. Two guiding grooves 201d are on the two lateral wall surfaces 201c corresponding to edges of the upper wall surface 201a, and the two guiding grooves 201d are arranged in parallel to each other. Each of the guiding grooves 201d is opened at a periphery of an opening of the installation trough 201. Moreover, the guiding grooves 201d extend toward the insertion hole 202 without connecting to the insertion hole 202; that is, in this embodiment, the length of the guiding groove 201d is smaller than a depth of a portion of the installation trough 201 where the portion of the installation trough 201 is extending from the front surface 210 to the rear surface 220. Furthermore, a first guiding protrusion 201e is on the upper wall surface 201a, the first guiding protrusion 201e is between the two lateral wall surfaces 201c and not connected to the two lateral wall surfaces 201c. The first guiding protrusion 201e extends from the insertion hole 202 toward the opening of the installation trough 201.

As shown in FIG. 7, the lateral opening 201b is in communication with the outer peripheral surface 230. Moreover, a second guiding protrusion 201f is extending from the insertion hole 202 toward the rear surface 220 and is arranged in the lateral opening 201b. Two open slot-holes 201g are formed between the second guiding protrusion 201f and the two lateral wall surfaces 201c, and the two open slot-holes 201g are arranged in parallel to each other.

As shown in FIGS. 5 and 6, the electrical terminal 100 is inserted into the installation trough 201 with its front end 111. Under this arrangement, in this embodiment, the junction part 116 has to correspond to the upper wall surface 201a, the two lateral plates 114 has to correspond to the two lateral wall surfaces 201c, and the lower edge 114b of the two lateral plates 114 has to correspond to the lateral opening 201b, so that the electrical terminal 100 will not be interfered by the wall surfaces, and the electrical terminal 100 can therefore continue to be inserted into the installation trough 201. Under this arrangement, the first guiding protrusion 201e enters into a portion between the two lateral plates 114 corresponding to the front end 111, and guides the front end 111 of the terminal body 110. Therefore, when a spacing between the first guiding protrusion 201e and the lateral wall surface 201c is equal to or slightly larger than the thickness of the lateral plate 114, better guiding and fixing effects can be achieved. Moreover, the interference lug 120 also slides into the guiding groove 201d, so that the junction part 116 can continue to enter into the installation trough 201.

As shown in FIG. 7, similarly, each of the circuit connection parts 130 slides into one of the two open slot-holes 201g, so that each of the circuit connection parts 130 can further protrude out of the base 200 through the lateral opening 201b.

As shown in FIG. 6, when a front edge of the junction part 116 is abutted against the first guiding protrusion 201e or when the interference lug 120 is abutted against a closed end of the guiding groove 201d, the terminal body 110 cannot continue to move toward the insertion hole 202. Under this arrangement, the interference lug 120 is embedded into the guiding groove 201d and the terminal body 110 is not detached off the base 200 from the lateral opening 201b. Hence, the electrical terminal 100 can be fixed in the base 200 to form the electrical connector 1. The interference lug 120 is combined with the guiding groove 201d to hold the electrical terminal 100 at a fixed position in the base 200, and to prevent the circuit connection part 130 from leaving a proper relative position. In order to prevent the first guiding protrusion 201e from interfering with the junction part 116, a distance between the front edge of the first guiding protrusion 201e and an edge of the opening of the installation trough 201 on the rear surface 220 should be equal to or smaller than the length of the guiding groove 201*d*. Therefore, a condition that the junction part 116 is in contact with the first guiding protrusion 201*e* when the terminal body 110 does not enter into the installation trough 201 completely, which causes the electrical terminal 100 cannot continue to be inserted into the installation trough 201 for positioning the electrical terminal 100, can be prevented.

In addition to the interference lug 120 and the guiding groove 201*d*, the first guiding protrusion 201*e* and the second guiding protrusion 201*f* also provides guiding and positioning effects. Moreover, the configuration of the first guiding protrusion 201*e* provides an outward supporting to the two lateral plates 114, thereby avoiding the portion of the two lateral plates 114 corresponding to the front end 111 from being deformed inwardly. The limiting and supporting functions provided by the second guiding protrusion 201*f* to the circuit connection part 130 can prevent the circuit connection part 130 from being deformed inwardly, thereby maintaining the relative positional relationship of the circuit connection part 130 on the electrical connector 1 and facilitating subsequent soldering process to the circuit board 300.

As shown in FIGS. 1, 2, and 3, the base 200 and the electrical terminal 100 can be further mounting on the circuit board 300. The circuit board 300 includes one or more soldering holes 310 and a fixation hole 320, the soldering hole 310 corresponds to the circuit connection part 130 of the electrical terminal 100, and the fixation hole 320 corresponds to a fixing structure 240 of the base 200. Each of the circuit connection parts 130 of the electrical terminal 100 is used to be inserted into one of the soldering holes 310, and the fixing structure 240 is used to be inserted into the fixation hole 320 for fixing the base 200 and the electrical terminal 100 on the circuit board 300. The fixing structure 240 may be a protruding column integrally formed on the outer peripheral surface 230 of the base 200, or may be a fixing pin adapted to be inserted into the fixation hole 320 through the base 200. As mentioned above, the open slot-hole 201*g* provides limiting and supporting functions for the circuit connection part 130 to prevent the circuit connection part 130 from being and deformed inwardly. Therefore, the circuit connection part 130 can be aligned with the soldering hole 310 easily so as to be inserted into the soldering hole 310, thereby avoiding a condition that the circuit connection parts 130 cannot be inserted into the corresponding soldering holes 310 at the same time when one or some of the circuit connection parts 130 are deformed and cannot be aligned properly with the soldering holes 310.

Figure 8:
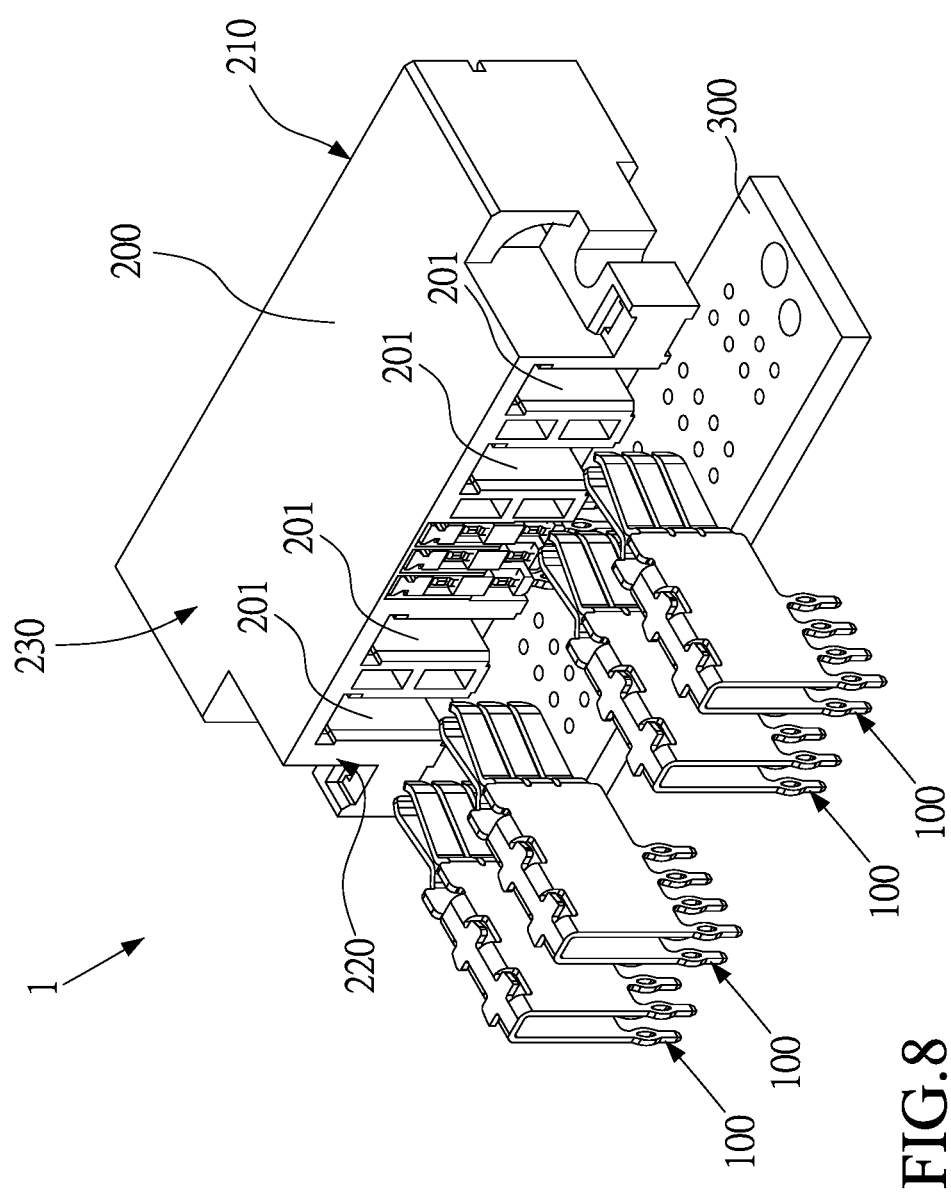
FIG. 8 illustrates an exploded view of an electrical connector according to a second embodiment of this disclosure.
Figure 9:
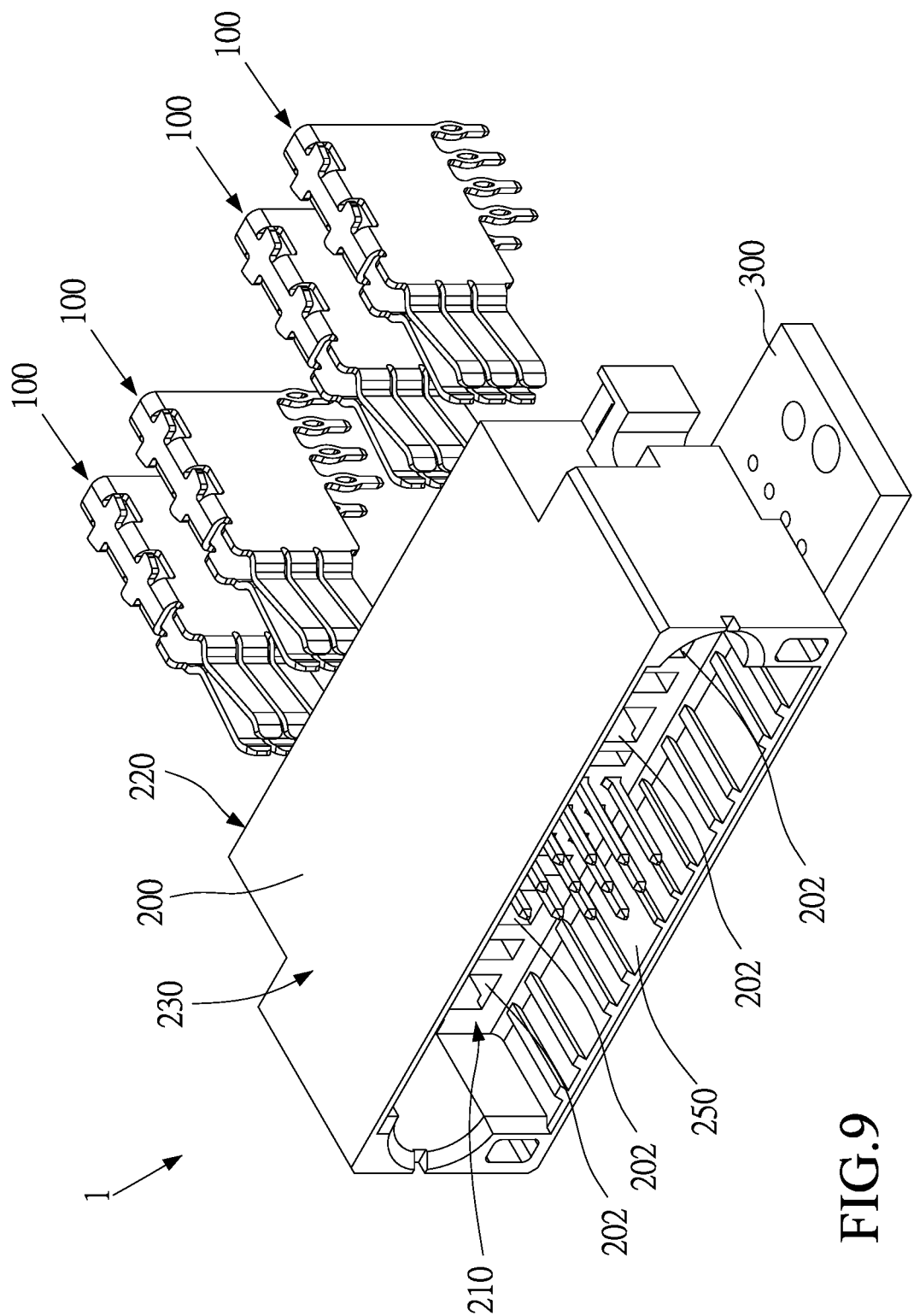
FIG. 9 illustrates another exploded view of the electrical connector of the second embodiment.
Figure 10:
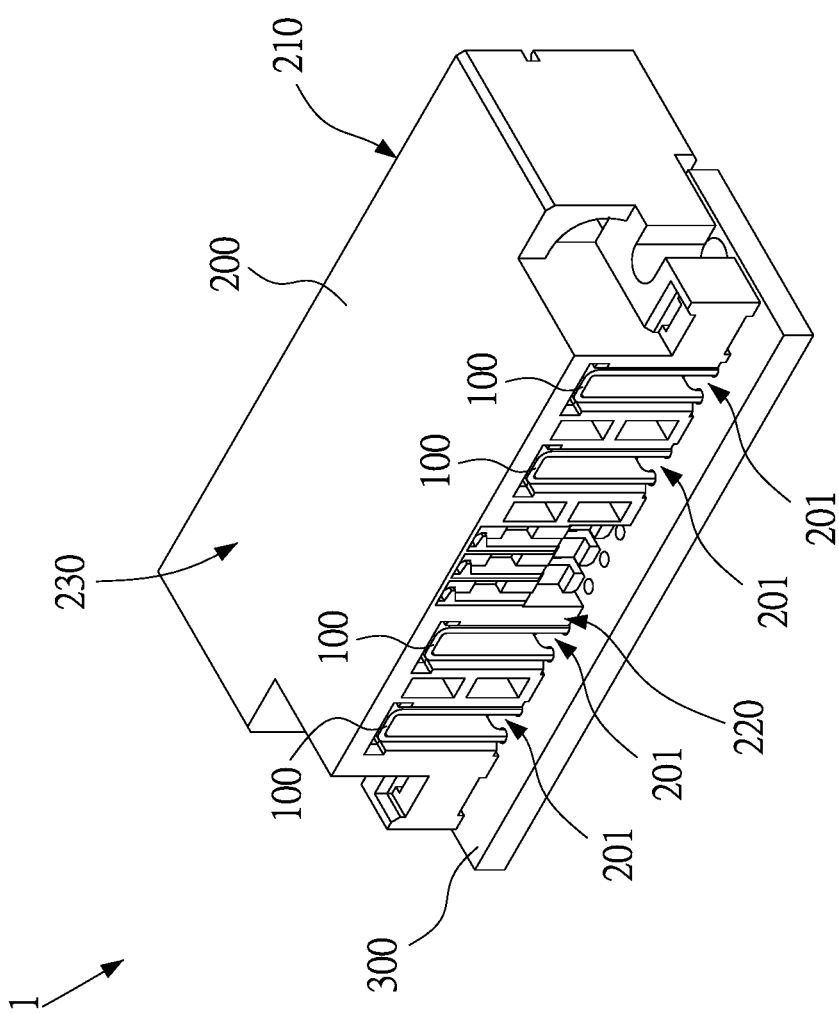
FIG. 10 illustrates a perspective view of the electrical connector of the second embodiment.

Please refer to FIGS. 8, 9, and 10, where an electrical connector according to a second embodiment of this disclosure is illustrated. In this embodiment, the electrical connector 1 comprises an electrical terminal 100 and a base 200.

Figure 11:
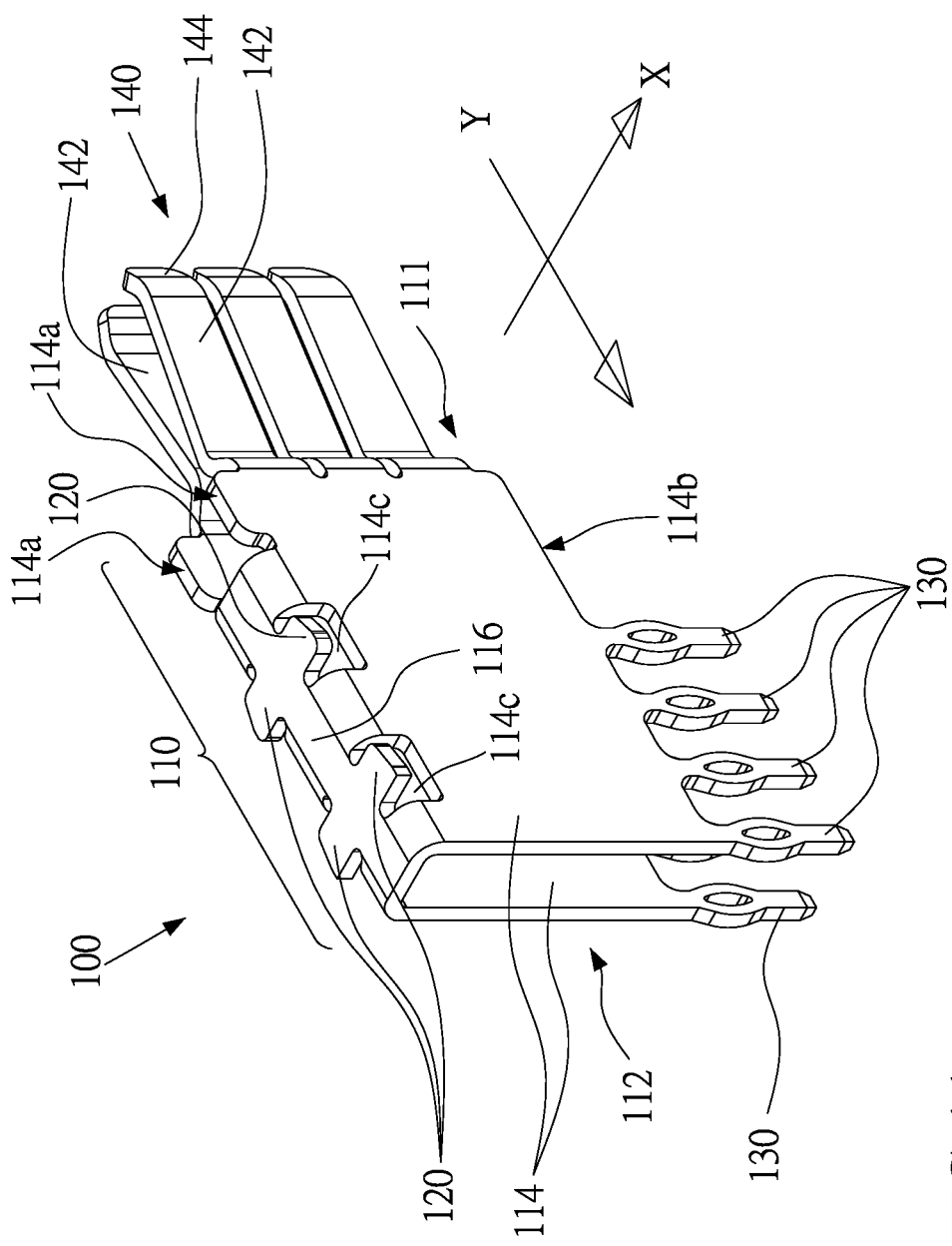
FIG. 11 illustrates a perspective view of an electrical terminal of the electrical connector of the second embodiment.

As shown in FIG. 11, most of the features of the electrical terminal 100 of the second embodiment are the same as that of the first embodiment, and the differences between the embodiments will be described below. In the second embodiment, the electrical terminal 100 further comprises a contact part 140 on the front end 111 of the terminal body 110. The contact part 140 comprises a plurality of elastic contact pieces 142 extending outwardly in the longitudinal direction Y from each of the lateral plates 140. The elastic contact pieces 142 are configured in pairs, and a front end of each of the elastic contact pieces 142 forms a guiding bevel 144 inclined inwardly.

Figure 12:
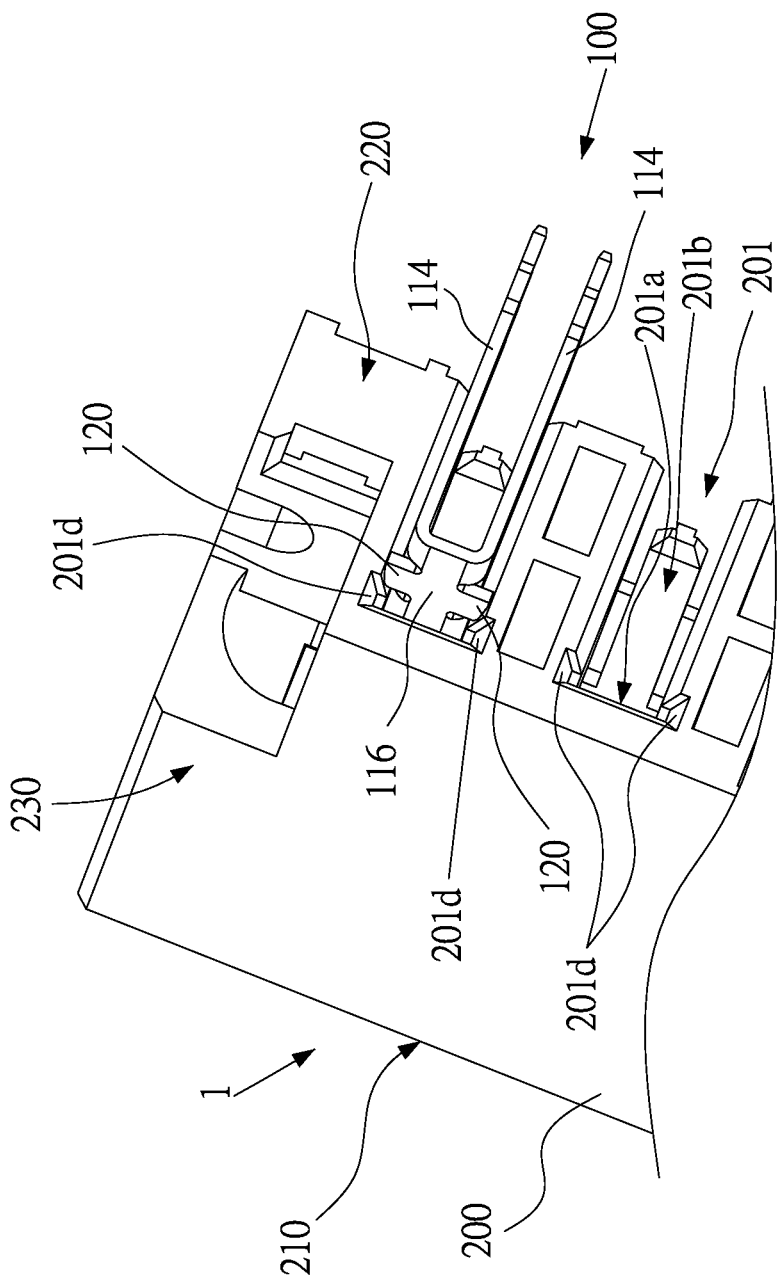
FIG. 12 illustrates a partial perspective view of the electrical connector of the second embodiment.
Figure 13:
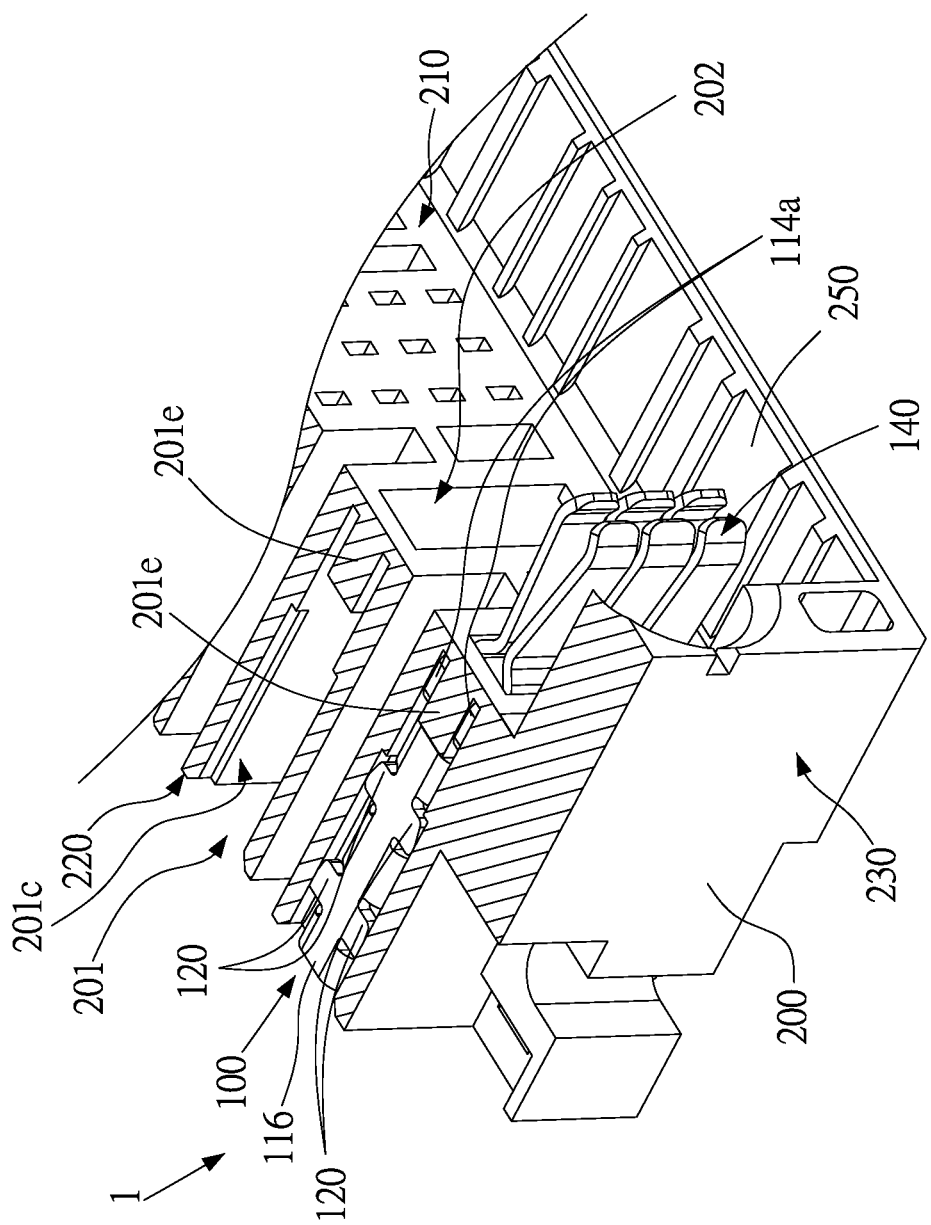
FIG. 13 illustrates a partial cross-sectional view of the electrical connector of the second embodiment.
Figure 14:
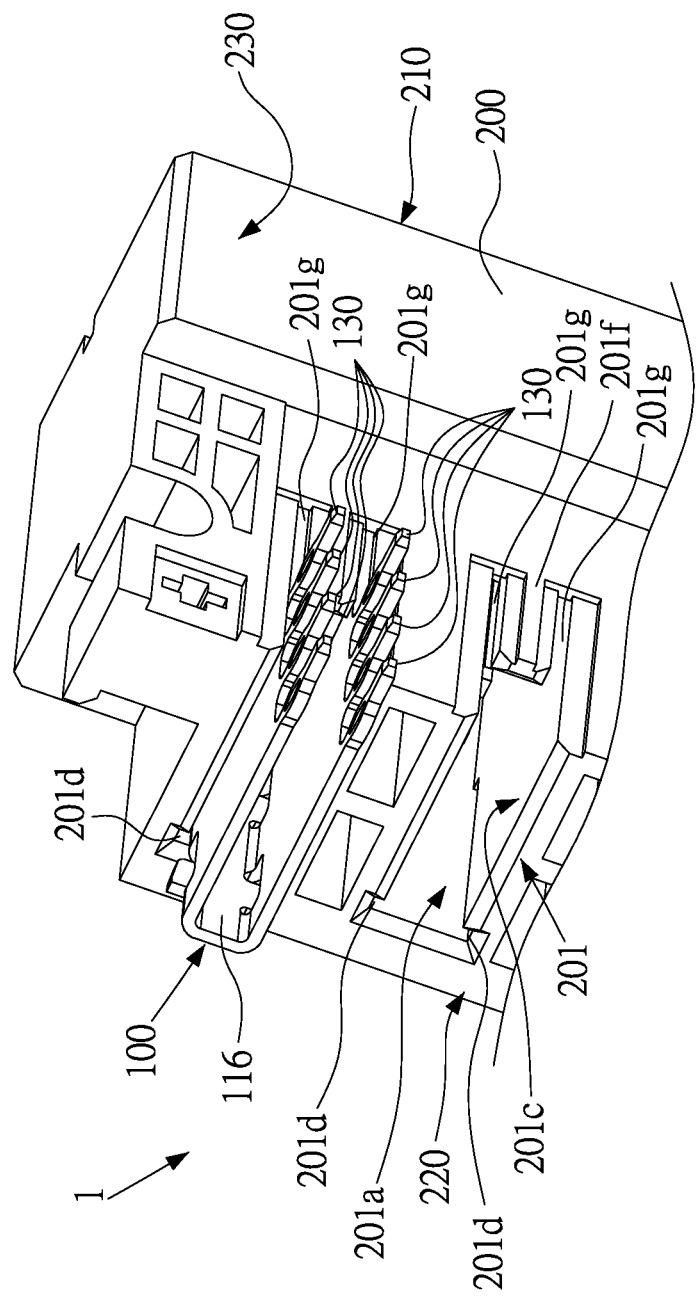
FIG. 14 illustrates another partial perspective view of the electrical connector of the second embodiment.

As shown in FIGS. 12, 13, and 14, the contact part 140 is inserted into the insertion hole 202 in the installation trough 201 and is further protruded from the front surface 210. In the second embodiment, the edge of the front surface 210 forms a side retaining wall 250 including an enclosing configuration. The space surrounded by the side retaining wall 250 is provided for receiving another electrical connector 1, such as the electrical connector 1 described in the first embodiment; the front face 210 of the electrical connector 1 in the first embodiment can be inserted into the space surrounded by the side retaining wall 250. Under this arrangement, in this embodiment, the contact part 140 can be further inserted into the insertion hole 202 of another electrical connector 1 and contact the electrical terminal 100 of the electrical connector 1.

Figure 15:
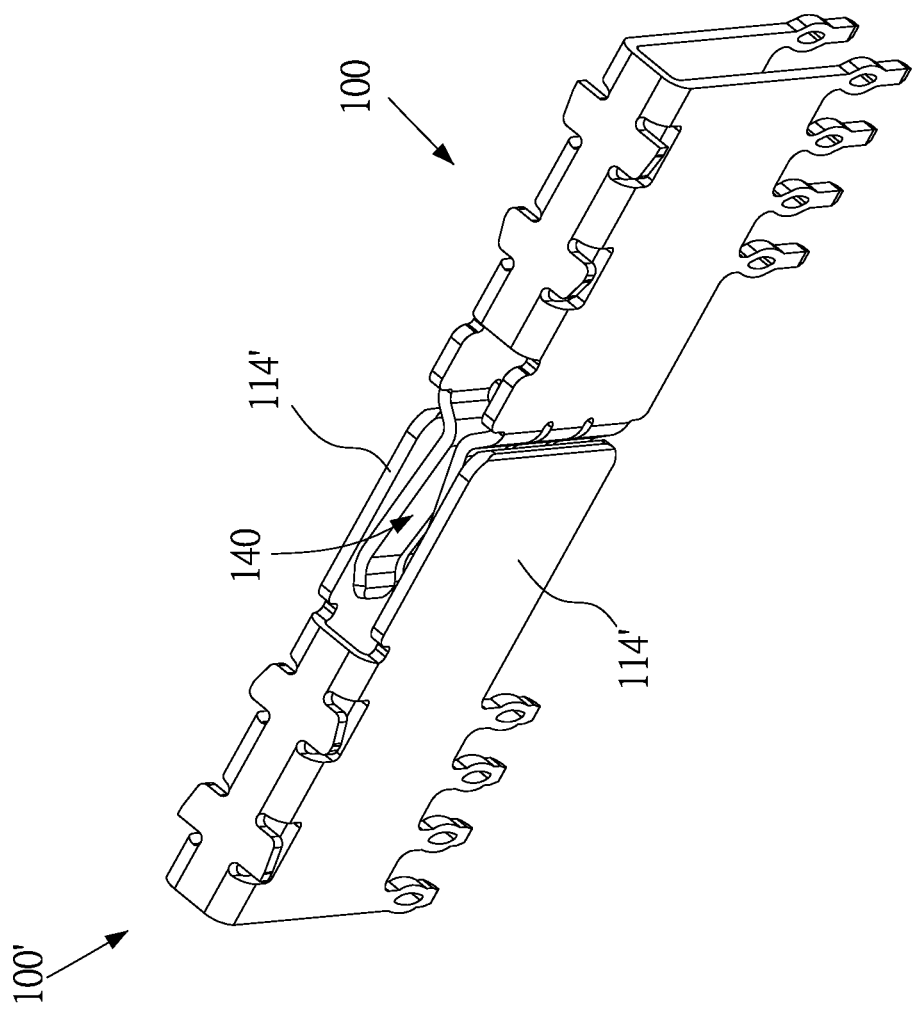
FIG. 15 illustrates a partial perspective view showing that the electrical terminal of the electrical connector of the second embodiment is connected to an external terminal.

As shown in FIG. 15, the electrical terminal 100 of the second embodiment and an external terminal 100' (that is, the electrical terminal 100 of the first embodiment) are matched with each other. The guiding bevel 144 facilitates the contact part 140 to be inserted between the two lateral plates 114' of the external terminal 100', thereby allowing a proper contact between the electrical terminal 100 and the external terminal 100' for electrical connection.

In one or more embodiments of this disclosure, the electrical terminal 100 comprises at least one interference lug 120 to match the at least one installation trough 201 of the base 200, for positioning and guiding the electrical terminal 100, thereby ensuring that the electrical terminal 100 can be inserted into the at least one installation trough 201 in the correct direction while maintaining the relative position of the electrical terminal 100 in the base 200. Furthermore, other structures disclosed in one or more embodiments of this disclosure can further provide positioning and guiding functions for the electrical terminal 100, thereby ensuring that the electrical terminal 100 from being installed incorrectly, and avoiding the deformation of the electrical terminal 100.

What is claimed is:

1. An electrical terminal, comprising:
   a terminal body, including a front end and a back end in a longitudinal direction, and the terminal body includes two lateral plates opposite to each other and a junction part, each of the two lateral plates includes an upper edge and a lower edge, the junction part is connected to the upper edge of each of the two lateral plates;
   at least one interference lug, arranged in parallel to the longitudinal direction and extending outwardly in a horizontal direction perpendicular to the longitudinal direction, and the at least one interference lug extends to a connection portion between the junction part and one of the lateral plates; and
   at least one circuit connection portion, connected to the terminal body.

2. The electrical terminal as claimed in claim 1, wherein the at least one interference lug is coplanar with the junction part.

3. The electrical terminal as claimed in claim 1, wherein a cutting slot-hole is formed at a connection portion between the junction part and one of the lateral plates, and the at least one interference lug is at an edge of the cutting slot-hole.

4. The electrical terminal as claimed in claim 1, wherein the junction part is connected to portions of the two upper edges corresponding to the back end of the terminal body.

5. The electrical terminal as claimed in claim 1, further comprising a contact part on the front end of the terminal body.

6. The electrical terminal as claimed in claim 1, wherein the contact part comprises a plurality of elastic contact pieces extending outwardly in the longitudinal direction from each of the lateral plates.

7. The electrical terminal as claimed in claim 6, wherein the elastic contact pieces are configured in pair, and a front end of each of the elastic contact pieces forms a guiding bevel inclined inwardly.

8. An electrical connector, comprises:
a base, including a front surface, a rear surface, and an outer peripheral surface, wherein the front surface and the rear surface are opposite to each other, and the outer peripheral surface is connected to the front surface and the rear surface; at least one installation trough is on the rear surface, and the at least one installation trough is in communication with the front surface through an insertion hole; wherein at least one guiding groove is arranged in the at least one installation trough, the at least one guiding groove is opened at a periphery of an opening of the at least one installation trough and extending toward the insertion hole without connecting to the insertion hole; and
at least one electrical terminal, including a terminal body, at least one interference lug, and at least one circuit connection part; wherein the terminal body includes a front end and a back end in a longitudinal direction; the at least one interference lug is arranged in parallel to the longitudinal direction and extending outwardly in a horizontal direction perpendicular to the longitudinal direction; and the at least one circuit connection part is connected to the terminal body, wherein the terminal body includes two lateral plates opposite to each other and a junction part, each of the two lateral plates includes an upper edge and a lower edge, the junction part is connected to the upper edge of each of the two lateral plates, the at least one interference lug extends to a connection portion between the junction part and one of the lateral plates;
wherein the front end of the terminal body is inserted into the at least one installation trough.

9. The electrical connector as claimed in claim 8, wherein the at least one installation trough includes an upper wall surface, a lateral opening, and two lateral wall surfaces, the two lateral wall surfaces connect the upper wall surface to the lateral opening, the lateral opening is in communication with the outer peripheral surface, the guiding groove is on one of the two side wall surfaces; and
the at least one circuit connection part is on one of the lower edges and protrudes from the base through the lateral opening.

10. The electrical connector as claimed in claim 9, wherein a first guiding protrusion is on the upper wall surface, the first guiding protrusion is between the two lateral wall surfaces and not connected to the two lateral wall surfaces, the first guiding protrusion extends from the insertion hole toward an opening on the rear surface of the at least one installation trough, and the first guiding protrusion enters into a portion between the two lateral plates corresponding to the front end.

11. The electrical connector as claimed in claim 10, wherein a distance between a front edge of the first guiding protrusion and an edge of the opening of the at least one installation trough on the rear surface is equal to or smaller than a length of the guiding groove.

12. The electrical connector as claimed in claim 9, wherein a second guiding protrusion extending from the insertion hole toward the rear surface is in the lateral opening, two open slot-holes are between the second guiding protrusion and the two lateral wall surfaces, and the two open slot-holes are arranged in parallel to each other; the at least one circuit connection part enters into one of the two open slot-holes, so that the at least one circuit connection part protrudes out of the base.

13. The electrical connector as claimed in claim 8, further comprising a circuit board, wherein the circuit board includes at least one soldering hole and at least one fixation hole, and the base further includes at least one fixing structure; the at least one circuit connection part is inserted into the at least one soldering hole, and the at least one fixing structure is inserted into the at least one fixation hole.

14. The electrical connector as claimed in claim 8, wherein the electrical terminal further comprises a contact part on the front end of the terminal body, and the contact part in the at least one installation trough is inserted into the insertion hole and protruded from the front surface.

* * * * *